United States Patent
Tokuyama et al.

(10) Patent No.: US 8,227,898 B2
(45) Date of Patent: Jul. 24, 2012

(54) OHMIC CONTACT ON A P-TYPE PRINCIPAL SURFACE TILTING WITH RESPECT TO THE C-PLANE

(75) Inventors: Shinji Tokuyama, Osaka (JP); Masahiro Adachi, Osaka (JP); Takashi Kyono, Itami (JP); Yoshihiro Saito, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 209 days.

(21) Appl. No.: 12/836,222

(22) Filed: Jul. 14, 2010

(65) Prior Publication Data

US 2011/0175103 A1     Jul. 21, 2011

(30) Foreign Application Priority Data

Jan. 18, 2010  (JP) ................. 2010-008189

(51) Int. Cl.
*H01L 29/20*       (2006.01)
*H01L 29/04*       (2006.01)

(52) U.S. Cl. . 257/615; 257/627; 257/628; 257/E21.086; 438/604

(58) Field of Classification Search .............. 257/615, 257/627, 628, E21.086; 438/604
See application file for complete search history.

(56) References Cited

U.S. PATENT DOCUMENTS

| | | | |
|---|---|---|---|
| 6,008,539 A | 12/1999 | Shibata et al. | |
| 7,851,243 B1* | 12/2010 | Ueno et al. | 438/46 |
| 2004/0130025 A1 | 7/2004 | Fujimoto et al. | |
| 2008/0315237 A1 | 12/2008 | Kamei et al. | |
| 2010/0297784 A1* | 11/2010 | Ueno et al. | 438/7 |
| 2011/0079790 A1* | 4/2011 | Yoshizumi et al. | 257/76 |
| 2012/0058583 A1* | 3/2012 | Yoshizumi et al. | 438/33 |
| 2012/0064700 A1* | 3/2012 | Odnoblyudov et al. | 438/479 |

FOREIGN PATENT DOCUMENTS

| | | |
|---|---|---|
| JP | 05-291621 A | 11/1993 |
| JP | 9-064337 A | 3/1997 |
| JP | 11-186605 A | 7/1999 |
| JP | 2004/247323 A | 9/2004 |
| JP | 2006-013474 | 1/2006 |
| JP | 2007-258375 | 10/2007 |
| JP | 4375497 | 9/2009 |

\* cited by examiner

*Primary Examiner* — Ngan Ngo

(74) *Attorney, Agent, or Firm* — Venable LLP; Michael A. Sartori; Michael E. Nelson

(57) ABSTRACT

A semiconductor device has a satisfactory ohmic contact on a p-type principal surface tilting from a c-plane. The principal surface 13a of a p-type semiconductor region 13 extends along a plane tilting from a c-axis (axis <0001>) of hexagonal group-III nitride. A metal layer 15 is deposited on the principal surface 13a of the p-type semiconductor region 13. The metal layer 15 and the p-type semiconductor region 13 are separated by an interface 17 such that the metal layer functions as a non-alloy electrode. Since the hexagonal group-III nitride contains gallium as a group-III element, the principal surface 13a comprising the hexagonal group-III nitride is more susceptible to oxidation compared to the c-plane of the hexagonal group-III nitride. The interface 17 avoids an increase in amount of oxide after the formation of the metal layer 15 for the electrode.

20 Claims, 4 Drawing Sheets

(a)

(b)

(a)

(b)

OHMIC CONTACT ON A P-TYPE PRINCIPAL SURFACE TILTING WITH RESPECT TO THE C-PLANE

BACKGROUND OF THE INVENTION

1. Field of the Invention

The present invention relates to a semiconductor device and a method for manufacturing the semiconductor device.

2. Related Background Art

Patent Literature 1 (Japanese Unexamined Patent Application Publication No. 05-291621) discloses an ohmic contact to a c-plane of a layer using a metal such as Ag or Ni on $Ga_xAl_{1-x}N$ doped with a p-type impurity. After the deposition of a metal layer, annealing is performed in an oxygen atmosphere. A high intensity light-emitting device having a low driving voltage is thereby produced using a gallium nitride-based semiconductor.

Patent Literature 2 (Japanese Unexamined Patent Application Publication No. 09-64337) discloses an ohmic contact of a c-plane to a p-type layer. A nickel layer is formed on a surface of $p^+$ layer, and a gold layer is formed on the nickel layer. Subsequently, through heat treatment, the distribution of the elements in depth direction is inverted. As a result, nickel and gold are distributed in that order from the surface.

Patent Literature 3 (Japanese Unexamined Patent Application Publication No. 11-186605) discloses an electrode formed on a p-type GaN contact layer. After a light-transmissive electrode is formed on a Mg-doped GaN contact layer 17, treatment of low resistivity of a p-type and alloying of the electrode are concurrently performed through annealing in a gas containing at least oxygen at a temperature of 500° C. to 600° C.

According to a method disclosed in Patent Literature 4 (Japanese Unexamined Patent Application Publication No. 2004-247323), an AlN buffer layer is formed on a sapphire substrate, and a GaN layer and a layered body doped with magnesium are formed on the AlN buffer, followed by heating at a temperature of 300° C. After the heating, a metal electrode having a thickness of 50 nm is formed on the layered body by vapor deposition.

SUMMARY OF THE INVENTION

The methods disclosed in Patent Literatures 1 and 2 lead to significantly satisfactory results on a p-type GaN on the c-plane of a GaN substrate. According to the inventor's knowledge, a satisfactory ohmic electrode, however, cannot be formed on a p-type GaN on a non-polar or a semipolar GaN substrate, probably due to a thick surface oxide film peculiar to a not-polar surface (the surface is not polar). A difference in the effect of oxide films results from a difference in state (Ga—O bond) of the surface oxide films between the polar c-plane and the not-polar surface. Experimental results by the inventors demonstrate existence of a thick oxide film causing poor electrical properties at the interface between GaN and an electrode on a not-polar surface. In addition, this oxide film is due to a difference in oxygen adsorption capability between the c-plane and not-polar surface, and a large amount oxide is formed at the interface between the not-polar GaN and the electrode through oxygen annealing for alloying the electrode.

An object of the present invention, accomplished under such a situation, is to provide a semiconductor device having a satisfactory ohmic contact on a p-type principal surface tilting with respect to the c-plane. Another object of the present invention is to provide a method for manufacturing the semiconductor device having a satisfactory ohmic contact on a p-type principal surface tilting with respect to the c-plane.

One aspect of the present invention is a semiconductor device having a non-alloy electrode. This semiconductor device comprises: (a) a p-type semiconductor region comprising hexagonal group-III nitride and having a principal surface extending along a plane that tilts from a c-axis of the hexagonal group-III nitride and differs from a c-plane of the hexagonal group-III nitride; and (b) a metal layer being deposited on the principal surface of the p-type semiconductor region. The hexagonal group-III nitride contains gallium as a group-III element. The metal layer and the p-type semiconductor region are stacked together so as to form an interface such that a non-alloy electrode is provided.

According to the inventor's knowledge, a tilting principal surface of a base comprising hexagonal group-III nitride is more susceptible to oxidation compared to the c-plane of hexagonal group-III nitride. As a result, alloying after the formation of a metal layer for an electrode causes the amount of oxide to increase at the interface between hexagonal group-III nitride and the electrode. According to the semiconductor device of the one aspect of the present invention, the metal layer and the p-type semiconductor region are stacked together so as to form the interface such that the non-alloy electrode is provided. This non-ally electrode can avoid an increase in amount of oxide through annealing after the formation of a metal layer for an electrode.

One aspect of the present invention is a method for manufacturing a semiconductor device. The method comprises the steps of: (a) preparing a base comprising a p-type semiconductor region which has a principal surface comprising hexagonal group-III nitride; and (b) forming a non-alloy electrode through deposition of a metal layer on the principal surface of the p-type semiconductor region. The hexagonal group-III nitride contains gallium as a group-III element. The principal surface of the p-type semiconductor region extends along a plane tilting from a c-axis of the hexagonal group-III nitride and being different from a c-plane of the hexagonal group-III nitride.

In the method according to the above described aspect, through deposition of the metal layer on a principal surface of a p-type semiconductor region of hexagonal group III nitride for forming a non-alloy electrode, an increase in amount of oxide by alloying after the formation of a metal layer for the electrode can be avoided, although the principal surface of the hexagonal group III nitride base is more susceptible to oxidation compared to the c-plane of hexagonal group III nitride.

The method according to one aspect of the present invention may further comprise a step of processing the p-type semiconductor region of the base by acid cleaning, prior to depositing the metal layer.

In the method according to the above described aspect, although natural oxidation prior to forming the metal layer affects the surface of the p-type semiconductor, an influence of the natural oxidation can be reduced as a result of the preprocessing. The processing is performed by immersing the base into at least one of hydrochloric acid, aqua regia, and hydrofluoric acid.

One aspect of the present invention is a non-alloy electrode. This non-alloy electrode comprises: (a) a p-type semiconductor region comprising hexagonal group-III nitride and having a principal surface extending along a plane that tilts from a c-axis of the hexagonal group-III nitride and differs from a c-plane of the hexagonal group-III nitride; and (b) a metal layer being deposited on the principal surface of the p-type semiconductor region. The hexagonal group-III nitride contains gallium as a group-III element. The metal layer and the p-type semiconductor region are stacked together so as to form an interface such that a non-alloy electrode is provided.

In the above described aspect, the metal layer may comprise at least one of platinum (Pt), palladium (Pd), and gold (Au). According to the above described aspect, these metal layers can provide good electrical properties.

In the above described aspect, the electrode is not annealed in an atmosphere containing oxygen, after the deposition of the metal layer. This can avoid the formation of oxides at the interface during annealing.

In the above described aspect, a tilt angle between a normal vector to the principal surface of the p-type semiconductor region and the c-axis may fall within a range of not less than 10 degrees and not more than 80 degrees, or a range of not less than 100 degrees and not more than 170 degrees. In the above described aspect, within a range of a tilt angle of less than 10 degrees or not less than 170 degrees, the principal surface of the p-type semiconductor region functions as a polar surface rather than a semipolar surface. Within a range of a tilt angle of not less than 80 degrees and not more than 100 degrees, the surface functions as a non-polar surface rather than a semipolar surface.

In the above described aspect, a tilt angle between a normal vector to the principal surface of the p-type semiconductor region and the c-axis may fall within a range of not less than 63 degrees and not more than 80 degrees, or a range of not less than 100 degrees and not more than 117 degrees. According to the above described aspect, within such a range of a tilt angle, a high-quality active layer in a blue-to-green wavelength region can be made. For example, in the case where the active layer includes a gallium nitride-based semiconductor layer containing indium (e.g. InGaN), indium element can be successfully incorporated. In addition, a gallium nitride-based semiconductor of InGaN or the like has a uniform indium distribution. Consequently, a light-emitting diode can emit uniform light, while a laser diode exhibits a low threshold current due to a uniform indium distribution. The non-alloy electrode can reduce the series resistance of devices.

In the above described aspect, the semiconductor device may further comprise a support base which comprises hexagonal group-III nitride. The support base has a semipolar principal surface. The p-type semiconductor region is deposited on the semipolar principal surface of the support base. According to the above described aspect, the semipolar principal surface can be readily provided on a p-type semiconductor region. In the above described aspect, the tilt angle between the normal vector to the semipolar principal surface of the support base and the c-axis of the support base may fall within a range of not less than 10 degrees and not more than 80 degrees, or a range of not less than 100 degrees and not more than 170 degrees. In the above described aspect, within a range of a tilt angle of the support base of less than 10 degrees or not less than 170 degrees, the principal surface of the p-type semiconductor region functions as a polar surface rather than a semipolar surface. Within a range of the tilt angle of not less than 80 degrees and not more than 100 degrees, the surface functions as a non-polar surface rather than a semipolar surface. Furthermore, the tilt angle between the normal vector to the semipolar principal surface of the support base and the c-axis of the support base may fall within a range of not less than 63 degrees and not more than 80 degrees, or a range of not less than 100 degrees and not more than 117 degrees. Within such a range of a tilt angle of the support base, a semipolar surface having a tilt angle which falls within a range of not less than 63 degrees and not more than 80 degrees, or a range of not less than 100 degrees and not more than 117 degrees can be readily provided on the principal surface of the p-type semiconductor region.

In the above described aspect, the base may further comprise an n-type semiconductor region and an active layer. The n-type semiconductor region and the active layer comprise hexagonal group-III nitride. The active layer is deposited between the n-type semiconductor region and the p-type semiconductor region. According to the above described aspect, an electrode having satisfactory ohmic characteristics can be provided for emitting devices.

In the above described aspect, the interface may contain an oxide layer which has a thickness of not more than 10 nm. According to the above described aspect, within the range of a thickness of the oxide layer, a satisfactory ohmic contact can be provided on a semipolar surface.

In the above described aspect, the oxide layer comprises gallium as a constituent element. The semipolar surface according to the above described aspect is susceptible to forming gallium oxide.

In the above described aspect, the oxide layer does not contain oxides of the constituent elements of the metal layer. Since the oxide layer according to the above described aspect is not formed during annealing of an electrode, the oxide is bonded primarily to the constituent element of the semipolar surface.

The above objects and the other objects, features, and advantages of the present invention can more readily become apparent in view of the following detailed description of the preferred embodiments of the present invention proceeding with reference to the accompanying drawings.

DESCRIPTION OF THE PREFERRED EMBODIMENTS

The expertise of the present invention can be readily understood in view of the following detailed description with reference to the accompanying drawings provided by way of illustration only. The following will describe embodiments of a non-alloy electrode, a semiconductor device having the non-alloy electrode, a method for manufacturing the non-alloy electrode, and a method for manufacturing the semiconductor device according to the present invention, with reference to the accompanying drawings. The same portions will be denoted by the same reference symbols if possible.

Figure 1:
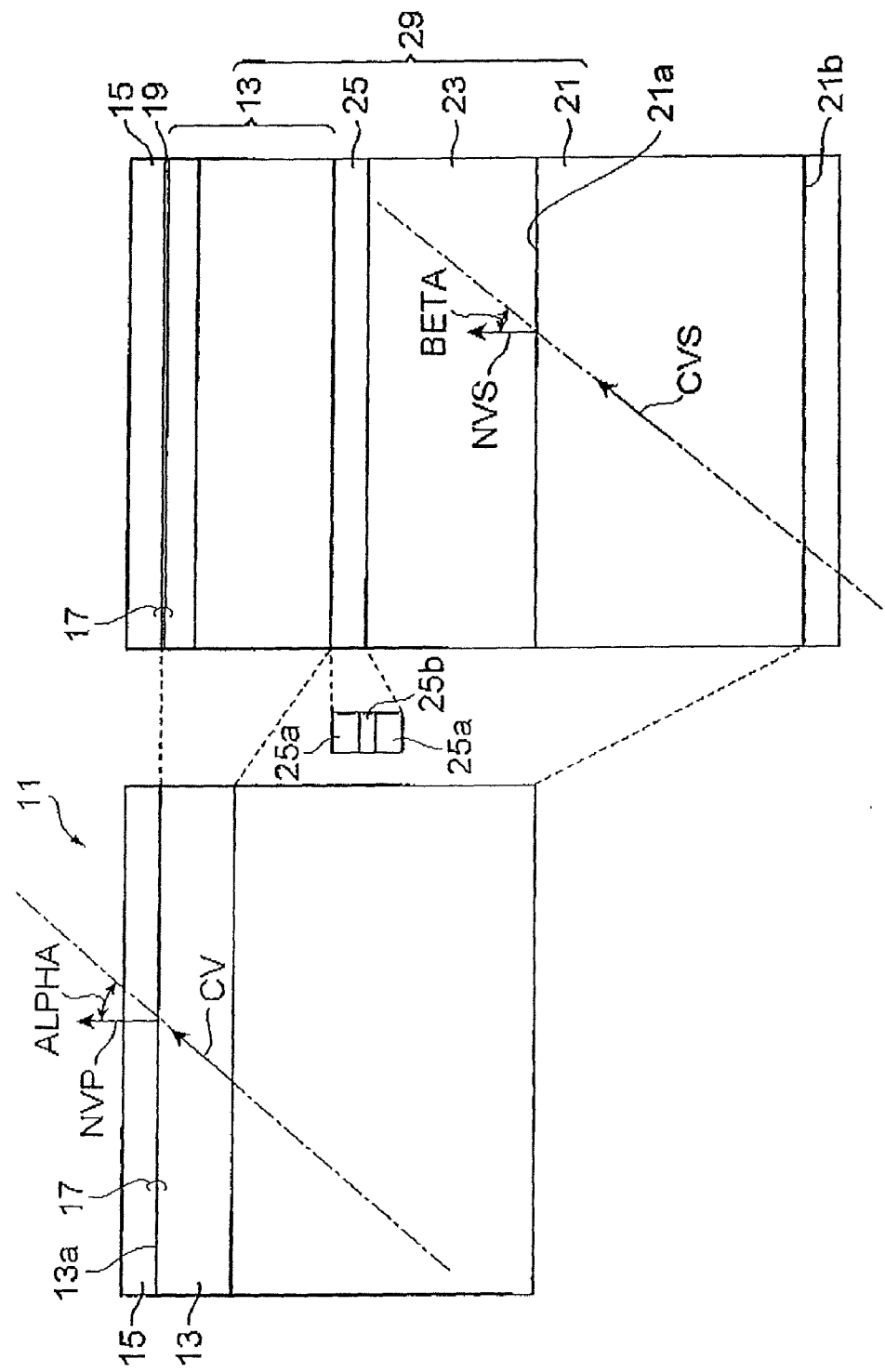
FIG. 1 is a drawing showing an example of a semiconductor device according to an embodiment.

FIG. 1 is a drawing showing an example of a semiconductor device according to an embodiment. A semiconductor device 11 has a non-alloy electrode. The semiconductor device 11 includes a p-type semiconductor region 13 and a metal layer 15. The p-type semiconductor region 13 comprises hexagonal group-III nitride. The hexagonal group-III nitride contains gallium as a group-III element, and may comprise, for example, a gallium nitride-based semiconductor. The gallium nitride-based semiconductor includes, for example, GaN, InGaN, AlGaN, and InAlGaN. The p-type semiconductor region 13 has a principal surface 13a, which extends along a plane tilting with respect to the c-axis (axis <0001>) of the hexagonal group-III nitride. Such a principal surface 13a is, for example, a semipolar surface. In FIG. 1, the direction of the c-axis is represented by a c-axis vector CV. The metal layer 15 is deposited on the principal surface 13a of the p-type type semiconductor region 13. The metal layer 15 is deposited on the p-type semiconductor region 13 to form an interface 17, and thus, a non-alloy electrode is formed.

According to the inventor's knowledge, the hexagonal group-III nitride contains gallium as a group-III element, and thus, the semipolar surface 13a comprising hexagonal group-III nitride is more susceptible to oxidation compared to the c-plane of the hexagonal group-III nitride. As a result, alloying after the formation of the metal layer 15 for an electrode causes the amount of oxide to increase at the interface between the hexagonal group-III nitride and the electrode. According to the semiconductor device 11 of the embodiment, the metal layer 15 is deposited on the p-type semiconductor region 13 to form the interface 17, and thus, a non-alloy electrode is formed. Consequently, an increase in amount of oxide by alloying after the formation of the metal layer 15 for an electrode can be avoided.

In an embodiment, the metal layer 15 may comprise at least one of platinum (Pt), palladium (Pd), gold (Au), and alloys thereof. These metal layers can provide satisfactory electrical properties. In order to form a non-alloy electrode by the constitution of the metal layer 15 and the p-type semiconductor region 13, the electrode is not annealed in an oxygen-containing atmosphere after the deposition of the metal layer 15 on the principal surface 13a. The generation of oxide at the interface during annealing of the electrode in this atmosphere can be avoided. For example, at a semipolar interface of a non-alloy electrode, the generation of oxide during annealing of the electrode in an oxygen atmosphere can be avoided.

In FIG. 1, a normal vector NVP to the principal surface 13a is shown. A tilt angle ALPHA between the normal vector NVP and a c-axis vector VC may fall within a range of not less than 10 degrees and not more than 170 degrees. According to the above described aspect, a semiconductor surface having a polarity different from a polarity of the polar c-plane is provided on the principal surface 13a of the substrate. Within a range of the tilt angle ALPHA of less than 10 degrees or not less than 170 degrees, the principal surface 13a of the p-type semiconductor region 13 functions as a polar surface rather than a semipolar surface. Within a range of the tilt angle of not less than 80 degrees and not more than 100 degrees, the surface functions as a non-polar surface rather than a semipolar surface. The tilt angle ALPHA may fall within a range of not less than 10 degrees and not more than 80 degrees, or a range of not less than 100 degrees and not more than 170 degrees. According to the above described aspect, a semipolar surface is provided on the principal surface 13a of the substrate.

The tilt angle ALPHA may fall within a range of not less than 63 degrees and not more than 80 degrees, or a range of not less than 100 degrees and not more than 117 degrees. Within such a range of the tilt angle ALPHA, the device has satisfactory electrical properties by appropriate selection of electrode material and preprocessing, due to a reduced amount of surface oxide.

The interface 17 may include an oxide layer 19. The preferred thickness of the oxide layer 19 is not more than 10 nm. Within such a range of the thickness of the oxide layer 19, a non-alloy contact between the semipolar surface and the metal layer is provided with satisfactory ohmic characteristics. Observation by the inventors demonstrates that the oxide layer 19 in the interface 17 has a thickness of at least about 0.5 nm. Since the principal surface 13a is susceptible to formation of gallium oxide, the oxide layer 19 contains gallium as a constituent element, but not contains the oxide of the constituent element of the metal layer 17. Since the oxide layer 19 is not formed during annealing of an electrode, the oxide is bonded primarily to the constituent element of the principal surface 13a.

The semiconductor device 11 may further comprise a support base 21 having a principal surface of hexagonal group-III nitride. The support base 21 may comprise GaN, InGaN, AlGaN, InAlGaN, AN, or the like. The support base 21 has a principal surface 21a and a back surface 21b. In an embodiment where the principal surface 21a is semipolar, a semipolar principal surface 13a of the p-type semiconductor region 13 can be readily provided. The p-type semiconductor region is deposited on the principal surface 21a of the substrate 21. A tilt angle BETA between a normal vector NVS to the principal surface 21a of the support base 21 and a c-axis vector CVS (direction of axis <0001>) of the substrate 21 may fall within a range of not less than 10 degrees and not more than 170 degrees. Within a range of the tilt angle BETA of less than 10 degrees or not less than 170 degrees, the principal surface 13a of the p-type semiconductor region 13 approximately functions as a polar c-plane, and does not have polar characteristics different from the polar c-plane. Within a range of the tilt angle BETA of not less than 80 degrees and not more than 100 degrees, the principal surface 13a of the p-type semiconductor region 13 functions as a non-polar surface rather than a semipolar surface. The tilt angle BETA may fall within a range of not less than 10 degrees and not more than 80 degrees, or a range of not less than 100 degrees and not more than 170 degrees. Within the range of the tilt angle, the principal surface 21a is semipolar. According to the embodiment described above, a light emitting device can be provided with an electrode having satisfactory ohmic characteristics.

The semiconductor device 11 may further comprise an n-type semiconductor region 23 of hexagonal group-III nitride and an active layer 25 of hexagonal group-III nitride. The active layer 25 is deposited between the n-type semiconductor region 23 and the p-type semiconductor region 13. A base 29 comprises the n-type semiconductor region 23, the active layer 25, and the p-type semiconductor region 13. The n-type semiconductor region 23, the active layer 25, and the p-type semiconductor region 13 are stacked sequentially on the principal surface 13a of the support base 13 along a direction of the normal vector NVS.

The active layer 25 may include a barrier layer 25a and a gallium nitride-based semiconductor layer 25b containing indium (e.g. a well layer). The well layer 25b may comprise, for example, InGaN, and the barrier layer 25a may comprise InGaN or GaN.

Within a range of the tilt angle BETA of not less than 63 degrees and not more than 80 degrees, or a range of the tilt angle BETA of not less than 100 degrees and not more than 117 degrees, the principal surface 13a of the p-type semiconductor region 13 is readily provided with a semipolar surface tilting at an angle in a range of not less than 63 degrees and not more than 80 degrees, or a range of not less than 100 degrees and not more than 117 degrees. For example, in the case where the active layer 25 includes an InGaN layer, the indium element can be successfully incorporated. This is advantageous for emission of long-wavelength light. In addition, a gallium nitride-based semiconductor of InGaN has a uniform indium distribution. Consequently, a light-emitting diode can emit uniform light, while a laser diode exhibits a low threshold current due to a uniform indium distribution. In the embodiments, the tilt angle BETA is practically equal to the tilt angle ALPHA if the effect of strains included in the crystal is neglected.

Figure 2:
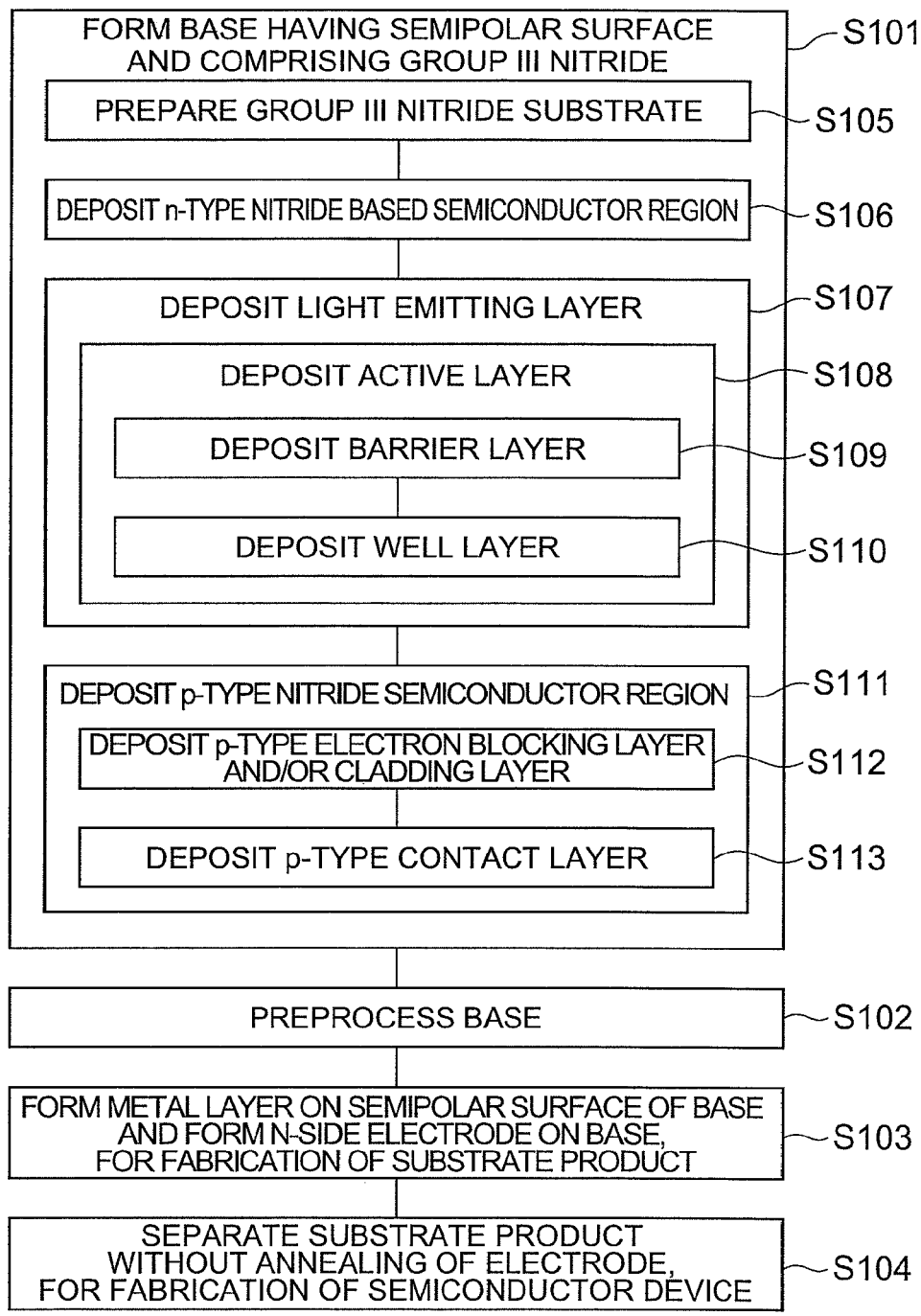
FIG. 2 is a flowchart showing step flow which contains main steps in a method for manufacturing the semiconductor device according to the embodiment.

FIG. 2 is a flowchart showing step flow which contains main steps in a method for manufacturing the semiconductor device according to the embodiment. In the following description, reference numerals of the parts used in manufacturing steps correspond to the same reference numerals of the parts in FIG. 1. In step 101, a base 29 is prepared. The base 29 includes a p-type semiconductor region 13. The p-type semiconductor region 13 has a principal surface 13a as the topmost surface of the base 29. The principal surface 13a may be, for example, a semipolar surface of hexagonal group-III nitride. The hexagonal group-III nitride contains gallium as a group-III element. The hexagonal group-III nitride may contain indium, aluminum, or the like as other group-III elements, while the hexagonal group-III nitride contains nitrogen as a group-V element. The principal surface 13a of the p-type semiconductor region 13 may comprise, for example, GaN doped with magnesium. The principal surface 13a of the p-type semiconductor region 13 extends along a surface tilting with respect to a c-axis of the hexagonal group-III nitride. Consequently, the principal surface 13a of the p-type semiconductor region 13 is semipolar. In the embodiment, the principal surface 13a is termed "semipolar principal surface".

Prior to deposition of a metal layer for a p-side electrode, in step 102, the p-type semiconductor region 13 of the base 29 may be preprocessed. After the formation of the base 29 through deposition of the p-type semiconductor region 13 in a deposition furnace, the base 29 (epitaxial substrate) is brought out from the deposition furnace and exposed to the atmosphere. Since an epitaxial surface of the epitaxial substrate has a different polarity from a polar c-plane, the surface may undergo natural oxidation by oxygen in the atmosphere. Although the natural oxidation prior to the formation of the electrode film has an effect on the surface 13a of the p-type semiconductor region 13, the preprocessing reduces the effect of the natural oxidation. The preprocessing is performed through immersion of the base 29 in a solution for acid cleaning, such as aqua regia or hydrofluoric acid.

In step 103, through deposition of a metal layer 15 on a principle surface 13a of the p-type semiconductor region 13, a non-alloy electrode is formed. Through these steps, a substrate product with an arrangement of semiconductor devices including a non-alloy electrode is formed.

According to this method, through deposition of the metal layer 15 on the principal surface 13a of the p-type semiconductor region 13 of hexagonal group-III nitride for forming a non-alloy electrode, an increase in amount of oxide by alloying after the formation of the metal layer 15 for the electrode can be avoided, although the principal surface 13a of the hexagonal group-III nitride is more susceptible to oxidation compared to the c-plane of the hexagonal group-III nitride. The metal layer 15 may comprise at least one of platinum (Pt), palladium (Pd), gold (Au), and alloys thereof. The metal layer can provide satisfactory electrical properties.

Since annealing of the electrode in an oxygen-containing atmosphere is not performed after the deposition of the metal layer 15, the interface does not undergo further formation of oxide at the interface 17 during annealing of the electrode. The contact resistance per unit area of such a non-alloy electrode may be, for example, not less than $2 \times 10^{-4} \Omega \cdot cm^2$ and not more than $6 \times 10^{-3} \Omega \cdot cm^2$. The tilt angle ALPHA between a normal vector NVP to the semipolar principal surface 13a of the p-type semiconductor region 13 and the c-axis vector CV may fall within a range of not less than 10 degrees and not more than 80 degrees, or a range of not less than 100 degrees and not more than 170 degrees, for example.

In step 104, a substrate product is separated without annealing of electrode in an oxygen atmosphere for fabrication of semiconductor device. Through these steps, a non-alloy electrode and a semiconductor device having the non-alloy electrode can be manufactured.

An embodiment of manufacturing the base 29 will be explained with reference to the steps of manufacturing a light emitting device as a semiconductor element. In step 105, a group-III nitride substrate is prepared. The group-III nitride substrate 21 may comprise, for example, GaN, AlGaN, InGaN, InAlGaN, AN, or the like. In the following embodiment, the substrate 21 has a semipolar principal surface. The group-III nitride substrate 21 includes a semipolar principal surface 21a. The semipolar principal surface 21a has the normal vector NVS tilting at a tilt angle BETA with respect to the c-axis vector CVS of the group-III nitride substrate 21 as described above. The c-axis may tilt in the direction of the a-axis or the m-axis of the group-III nitride substrate 21.

In step 106, an n-type group-III nitride semiconductor region 23 is deposited on the semipolar principal surface 21a of the group-III nitride substrate 21. The n-type group-III nitride semiconductor region 23 may be an n-type cladding layer or the like. The n-type cladding layer may comprise a quaternary, ternary, or binary group-III nitride semiconductor, for example, GaN, AlGaN, InAlGaN, InAlN, or the like, each doped with silicium. The principal surface of the n-type group-III nitride semiconductor region 23 is semipolar.

In step 107, a light emitting layer is deposited on the principal surface of the n-type group-III semiconductor region 23. The light emitting layer includes an active layer 25. The light emitting layer may include light guide layers deposited on both sides of the active layer 25, if needed. In step 108, the active layer 25 is deposited. The active layer 25 may have a quantum well structure. In step 109, a barrier layer 25a is deposited on a principal surface of the n-type group-III nitride semiconductor region 23. The surface of the barrier layer 25a is semipolar. In step 110, a well layer 25b is deposited on the principal surface of the barrier layer 25a. The surface of the well layer 25b is semipolar. The depositions of the barrier layer 25a and the well layer 25b may be alternatively repeated, if needed. The surfaces of the completed light emitting layer and the completed active layer 25 are semipolar. The semipolar active layer is lightly affected by the piezoelectric field compared to the c-plane.

In step 111, the p-type group-III nitride semiconductor region 13 is deposited on the semipolar principal surface of the light emitting layer. The p-type group-III nitride semiconductor region 13 may include a p-type electron-blocking layer, a p-type cladding layer, a p-type contact layer or the like. In step 112, the p-type electron-blocking layer and/or the p-type cladding layer are/is deposited on the active layer 25. The p-type cladding layer may comprise quaternary, ternary, or binary group-III nitride semiconductor, for example, GaN, AlGaN, InAlGaN, InAlN, or the like, each doped with magnesium. In step 113, after deposition of the p-type electron-blocking layer and/or the p-type cladding layer, the p-type contact layer may be formed. The p-type contact layer may comprise quaternary, ternary, or binary group-III nitride semiconductor, for example, GaN, AlGaN, InAlGaN, InAlN, or the like, each doped with magnesium. A concentration of p-type dopant of the p-type contact layer may be in a range of not less than $5 \times 10^{19}$ cm$^{-3}$ and not more than $5 \times 10^{20}$ cm$^{-3}$, for example.

Through these steps, the formation of the epitaxial substrate is completed, and thus, a base 29 is provided.

The embodiment is based on the finding that a semipolar p-type GaN ohmic electrode is successfully formed using, for example, platinum, without an annealing process.

First, the inventors form a p-type electrode on a p-type semipolar GaN layer through annealing in oxygen atmosphere after deposition of a metal layer. Although a p-side electrode is formed through an alloying step in the oxygen atmosphere after stacking Ni/Au metal layers on a p-type GaN semipolar surface (20-21), this p-side electrode do not have satisfactory ohmic characteristics. Alternatively, a platinum electrode is formed on a p-type GaN semipolar surface (20-21) by a method of making the platinum electrode at a high temperature. This platinum electrode does also not have satisfactory ohmic characteristics. A satisfactory ohmic electrode is formed by these techniques to form an electrode on a polar c-plane of a p-type GaN. A satisfactory ohmic electrode, however, is not obtained by the conventional two methods applied to semipolar GaN.

In order to clarify this reason, a GaN surface of c-plane and the semipolar GaN surface are analyzed by the X-ray photoelectron spectroscopy (XPS). The results show that the semipolar GaN surface has a thicker surface oxide film (higher density of Ga—O bond) compared to the GaN surface of c-plane. In the two methods of manufacturing described above, an oxide film is also observed at the interface between GaN and the electrode after alloying, whereas a thick oxide film such as the c-plane is not observed on the non-alloy platinum electrode in the embodiment.

The inventors assume that the annealing in an oxygen-containing atmosphere causes oxidation of the interface between the metal electrode and the p-type semiconductor crystal to increase the contact resistance. Since the state of bonding (dangling bond) at a semipolar nitride surface is different from the state of bonding at a surface of c-plane, the semipolar nitride surface is susceptible to bonding with oxygen. Consequently, it is assumed that oxygen provided by alloying reaches the interface between the nitride and the electrode to deposit the oxide at the interface.

The inventors develop an electrode that can be formed without annealing. In the process for forming the electrode, a platinum electrode film is deposited by vapor deposition at a normal temperature, for example, from 15° C. to 40° C., and the electrode film is not annealed. The platinum electrode has satisfactory ohmic characteristics, and the semiconductor device has satisfactory electrical properties such as contact resistance measured by using the TLM method, I-V characteristics of p-n diodes, or the like. The results of XPS show no signal assigned to an gallium-oxygen bond at the interface between the electrode and the p-type semiconductor region. The results suggest that the oxide film has a thickness of not more than 10 nm. Furthermore, the inventors think of a possibility that an oxide film having a thickness of about 0.5 nm remains at the interface. In other words, in the case where a platinum electrode is formed at a normal temperature and the oxide film at the interface between the electrode and the group-III nitride semiconductor has a thickness of not less than 0.5 nm and not more than 10 nm, a satisfactory ohmic electrode is formed. A palladium electrode, a gold electrode, and an alloy electrode thereof also achieve the same results as the results achieved in the case of the platinum electrode.

In the embodiment described above, prior to the deposition of the platinum electrode, the p-type GaN crystal having a c-plane or semipolar surface is subjected to ultrasonic cleaning in an organic solvent such as acetone or 2-propanol and then acid cleaning with hydrochloric acid, aqua regia, or hydrofluoric acid. The cleaning time is about 5 minutes in a solution. The acid cleaning improves properties of the ohmic electrode.

EXAMPLE 1

Figure 3:
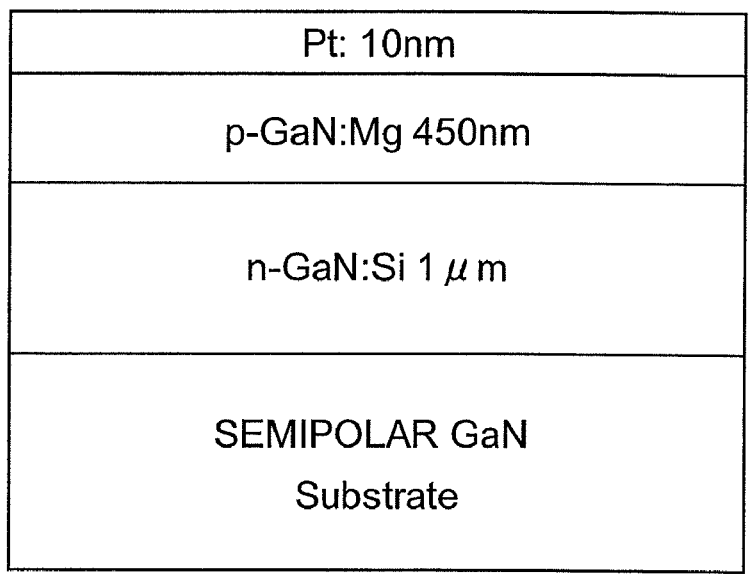
FIG. 3 is a drawing showing characteristics of an alloy electrode and a non-alloy electrode on a semipolar p-type GaN surface.
Figure 3:
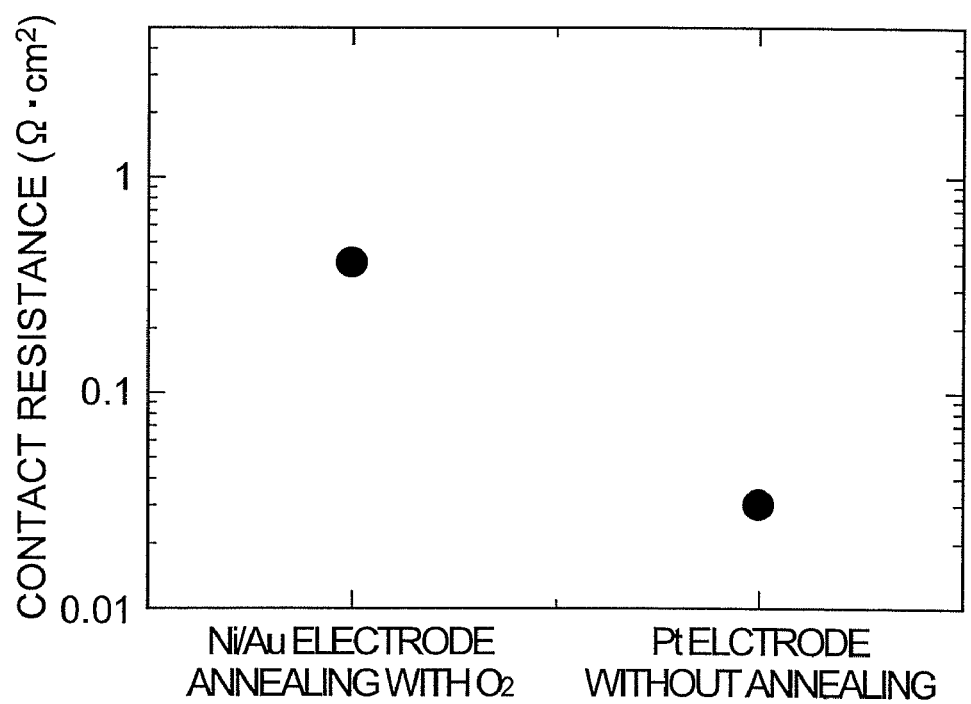

An epitaxial substrate having a structure shown in Part (a) of FIG. 3 is made by metalorganic chemical vapor deposition (MOCVD). A GaN buffer layer may be deposited, if necessary, on a semipolar surface having a c-axis tilting toward an m-axis of an n-type GaN substrate by MOCVD. Subsequently, an n-type GaN layer doped with silicium having a thickness of 1 μm, a p-type GaN layer doped with magnesium having a thickness of 0.4 μm, and p$^+$-type GaN layer heavily doped with magnesium having a thickness of 50 nm are deposited.

Prior to the deposition of a p-type electrode film, a circular resist is formed by photolithography. Subsequently, in the same deposition system, a platinum film having a thickness of 50 nm and a Ni/Au film having a thickness of 5 nm/11 nm are deposited by electron beam evaporation and resistive heating, respectively. The degree of vacuum is about $1\times10^{-6}$ Torr.

After the deposition, the resist is lifted off in acetone to form platinum electrodes having a doughnut-shaped gap. The resistance between the inner electrode and the outer electrode isolated by the gap is measured, and then, the contact resistance of the platinum electrode is evaluated by using the c-TLM method. The results are shown in Part (b) of FIG. 3.

result, resistance

Pt electrode: $5\times10^{-3}\Omega\cdot cm^2$;
Ni/Au film: $3\times10^{-2}\Omega\cdot cm^2$

EXAMPLE 2

The interface between GaN and an electrode is analyzed by X-ray photoelectron spectroscopy (XPS). An epitaxial substrate with a surface of c-plane (device A for evaluation) and a semipolar epitaxial substrate (device B for evaluation) are deposited by epitaxy as in Example 1. A platinum electrode is deposited by electron beam evaporation on each of these epitaxial substrates (devices A and B) to form a substrate product with a surface of c-plane (device C for evaluation) and a semipolar substrate product (device D for evaluation). In addition, a Ni/Au film is deposited on each of these epitaxial substrates (devices A and B) by electron beam evaporation and then resistive heating to form a substrate product with a surface of c-plane (device E for evaluation) and a semipolar substrate product (device F for evaluation).

In the manufacturing process of all the devices for evaluation, the epitaxial substrates are subjected to the organic cleaning and acid cleaning prior to the deposition, as described above. In addition, devices E and F are annealed for 1 minute in a nitrogen atmosphere containing a small amount of oxygen.

The surface oxide film of device B for evaluation has a greater thickness (higher density of Ga—O bond) compared to the surface oxide film of device A. An oxide film of device F at the interface between GaN and the electrode has a greater thickness compared to an oxide film of device E. In devices C and D, however, the oxide film is not observed.

Figure 4:
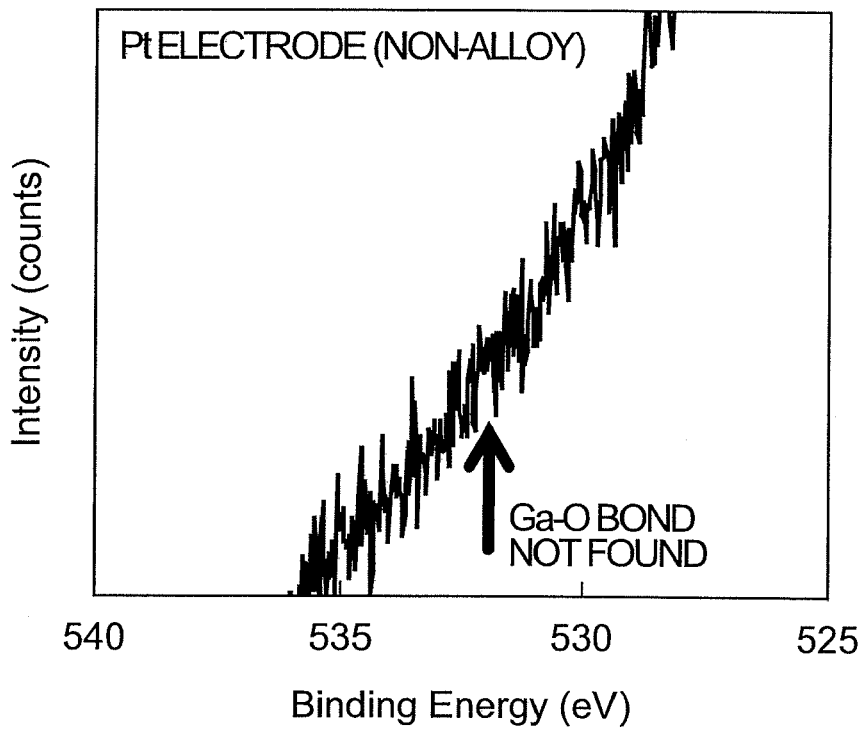
FIG. 4 is drawing showing the results of XPS of an alloy electrode and a non-alloy electrode on a semipolar p-type GaN surface.
Figure 4:
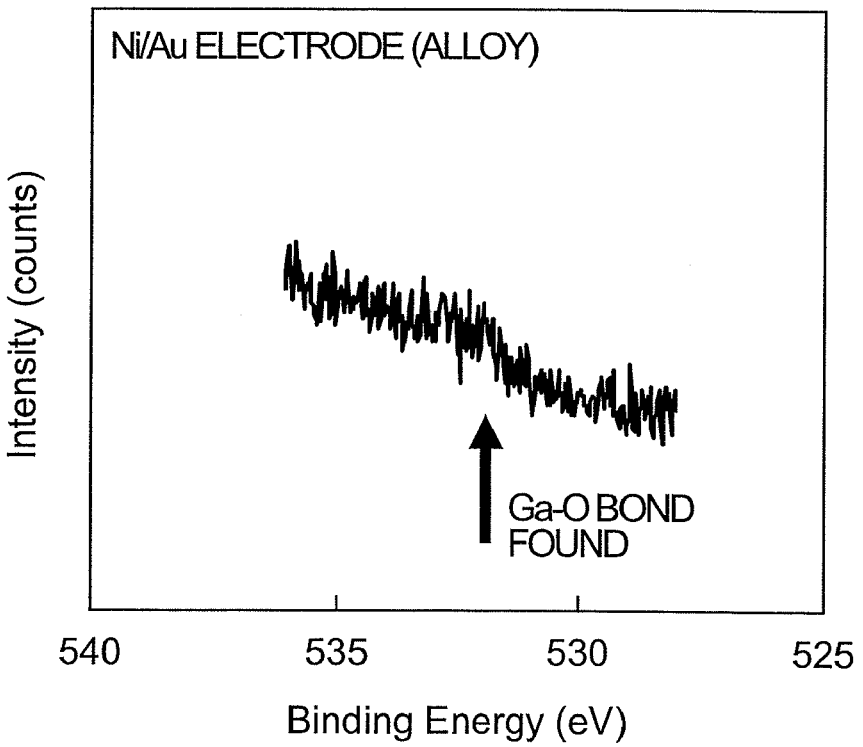

Part (a) of FIG. 4 is a drawing showing XPS signals in the range of the Ga—O bond energy of a non-alloy electrode on the semipolar surface, while Part (b) of FIG. 4 is a drawing showing XPS signals in the range of the Ga—O bond energy of an alloy electrode on the semipolar surface.

The results shown in FIG. 4 suggest that a semipolar substrate is susceptible to surface oxidation, which precludes achieving an ohmic contact, whereas it is confirmed that the oxide film is not formed in the case of a non-alloy electrode without annealing on the semipolar substrate. In addition, acid processing enhances the ohmic contact.

EXAMPLE 3

In order to confirm the dependence of semipolar characteristics on the tilt angle, four semipolar substrates having a tilt angle of +5 degrees, −5 degrees, +10 degrees, and −10 degrees, respectively, from the (20-21) plane, and a not-polar substrate with a surface of m-plane are prepared. Epitaxial substrates are made by using these GaN substrates as in Example 2. The epitaxial substrates are analyzed by using the XPS as in Example 2. The results demonstrate that non-alloy platinum electrode formed on an epitaxial substrate using a semipolar or non-polar GaN substrate has a superior interface to an alloy electrode on a c-plane. Within the range of the tilt angle, no significant difference is observed in electrical properties measured. Consequently, a non-alloy electrode formed on a substrate having a not-polar (i.e. semipolar or non-polar) principal surface having different characteristics from a polar c-plane has satisfactory ohmic characteristics.

As described above, the embodiment provides a semiconductor device having satisfactory ohmic characteristics on a p-type principal surface tilting from a c-plane. Also, the embodiment provides a method for manufacturing a semiconductor device having satisfactory ohmic characteristics on a p-type principal surface tilting from a c-plane. Furthermore, the embodiment provides a non-alloy electrode having satisfactory ohmic characteristics on a p-type principal surface tilting from a c-plane. In addition, the embodiment provides a method for manufacturing a non-alloy electrode having satisfactory ohmic characteristics on a p-type principal surface tilting from a c-plane.

Having described and illustrated the principle of the invention in a preferred embodiment thereof, it is appreciated by those having skill in the art that the invention can be modified in arrangement and detail without departing from such principles. Although a light emitting device is described for illustrative purposes in the embodiments, a p-side electrode of electronic devices such as transistors and diodes is also available. We therefore claim all modifications and variations coming within the spirit and scope of the following claims.

What is claimed is:

1. A semiconductor device having a non-alloy electrode comprising:
    a p-type semiconductor region comprising hexagonal group-III nitride and having a principal surface extending along a plane that tilts from a c-axis of the hexagonal group-III nitride and differs from a c-plane of the hexagonal group-III nitride; and
    a metal layer being deposited on the principal surface of the p-type semiconductor region,
    the hexagonal group-III nitride containing gallium as a group-III element,
    the metal layer and the p-type semiconductor region being stacked together so as to form an interface such that a non-alloy electrode is provided.

2. The semiconductor device according to claim 1, wherein the metal layer comprises at least one of platinum (Pt), palladium (Pd), and gold (Au).

3. The semiconductor device according to claim 1, wherein a tilt angle between a normal vector to the principal surface of the p-type semiconductor region and the c-axis falls within a range of not less than 10 degrees and not more than 80 degrees, or a range of not less than 100 degrees and not more than 170 degrees.

4. The semiconductor device according to claim 1, wherein a tilt angle between a normal vector to the principal surface of the p-type semiconductor region and the c-axis falls within a range of not less than 63 degrees and not more than 80 degrees, or a range of not less than 100 degrees and not more than 117 degrees.

5. The semiconductor device according to claim 1, further comprising a support base which comprises hexagonal group-III nitride,
    the support base having a semipolar principal surface,
    the p-type semiconductor region being deposited on the semipolar principal surface of the support base,
    the principal surface being semipolar.

6. The semiconductor device according to claim 5, wherein a tilt angle between the semipolar principal surface of the support base and a c-axis of the support base falls within a range of not less than 63 degrees and not more than 80 degrees, or a range of not less than 100 degrees and not more than 117 degrees.

7. The semiconductor device according to claim 1, further comprising an n-type semiconductor region and an active layer,
    the n-type semiconductor region and the active layer comprising hexagonal group-III nitride,
    the active layer being deposited between the n-type semiconductor region and the p-type semiconductor region.

8. The semiconductor device according to claim 1, wherein the interface comprises an oxide layer having a thickness of not more than 10 nm.

9. The semiconductor device according to claim 8, wherein the oxide layer comprises gallium as a constituent element.

10. The semiconductor device according to claim 8, wherein the oxide layer does not contain oxide of the constituent element of the metal layer.

11. A method for manufacturing a semiconductor device, the method comprising the steps of:
    preparing a base comprising a p-type semiconductor region which has a principal surface comprising hexagonal group-III nitride; and
    forming a non-alloy electrode through deposition of a metal layer on the principal surface of the p-type semiconductor region,
    the hexagonal group-III nitride containing gallium as a group-III element,
    the principal surface of the p-type semiconductor region extending along a plane that tilts from a c-axis of the hexagonal group-III nitride and differs from a c-plane of the hexagonal group-III nitride.

12. The method for manufacturing a semiconductor device according to claim 11, wherein the metal layer comprises at least one of platinum (Pt), palladium (Pd), and gold (Au).

13. The method for manufacturing a semiconductor device according to claim 11, further comprising a step of processing the p-type semiconductor region of the base by acid cleaning, prior to depositing the metal layer.

14. The method for manufacturing a semiconductor device according to claim 11, wherein a tilt angle between a normal vector to the principal surface of the p-type semiconductor and the c-axis falls within a range of not less than 10 degrees and not more than 80 degrees, or a range of not less than 100 degrees and not more than 170 degrees.

15. The method for manufacturing a semiconductor device according to claim 11, wherein a tilt angle between a normal vector to the principal surface of the p-type semiconductor and the c-axis falls within a range of not less than 63 degrees and not more than 80 degrees, or a range of not less than 100 degrees and not more than 117 degrees.

16. The method for manufacturing a semiconductor device according to claim 11, wherein the electrode is not annealed in an atmosphere containing oxygen, after the deposition of the metal layer.

17. The method for manufacturing a semiconductor device according to claim 11,
- the metal layer and the p-type semiconductor region being stacked together so as to form an interface,
- the interface containing an oxide layer which has a thickness of not more than 10 nm.

18. The method for manufacturing a semiconductor device according to claim 11,
- the base comprising a support base of hexagonal group-III nitride,
- the support base having a semipolar principal surface,
- the p-type semiconductor region being deposited on the semipolar principal surface of the support base,
- the principal surface being semipolar.

19. The method for manufacturing a semiconductor device according to claim 18, wherein a tilt angle between a normal vector to the semipolar principal surface of the support base and a c-axis of the hexagonal group-III nitride of the support base falls within a range of not less than 63 degrees and not more than 80 degrees, or a range of not less than 100 degrees and not more than 117 degrees.

20. The method for manufacturing a semiconductor device according to claim 18,
- the base further comprising an n-type semiconductor region and an active layer,
- the n-type semiconductor region and the active layer comprising hexagonal group-III nitride,
- the n-type semiconductor region being deposited on the semipolar principal surface of the support base,
- the active layer being deposited on the semipolar principal surface of the support base,
- the active layer being deposited between the n-type semiconductor region and the p-type semiconductor region.

* * * * *